United States Patent
Sharma et al.

(10) Patent No.: US 11,658,222 B2
(45) Date of Patent: May 23, 2023

(54) THIN FILM TRANSISTOR WITH CHARGE TRAP LAYER

(71) Applicant: Intel Corporation, Santa Clara, CA (US)

(72) Inventors: Abhishek A. Sharma, Hillsboro, OR (US); Van H. Le, Beaverton, OR (US); Jack T. Kavalieros, Portland, OR (US); Tahir Ghani, Portland, OR (US); Gilbert Dewey, Hillsoboro, OR (US); Shriram Shivaraman, Hillsboro, OR (US); Sean T. Ma, Portland, OR (US); Benjamin Chu-Kung, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 37 days.

(21) Appl. No.: 16/633,603

(22) PCT Filed: Sep. 27, 2017

(86) PCT No.: PCT/US2017/053588
§ 371 (c)(1),
(2) Date: Jan. 24, 2020

(87) PCT Pub. No.: WO2019/066790
PCT Pub. Date: Apr. 4, 2019

(65) Prior Publication Data
US 2020/0185504 A1    Jun. 11, 2020

(51) Int. Cl.
*H01L 29/423* (2006.01)
*H01L 29/40* (2006.01)
(Continued)

(52) U.S. Cl.
CPC .... *H01L 29/4234* (2013.01); *H01L 29/40117* (2019.08); *H01L 29/518* (2013.01); *H01L 29/66833* (2013.01); *H01L 29/786* (2013.01)

(58) Field of Classification Search
CPC ................... H01L 29/40117; H01L 29/786
See application file for complete search history.

(56) References Cited

U.S. PATENT DOCUMENTS 8,026,136 B2    9/2011    Shih et al.
8,067,284 B1 *  11/2011   Levy ................ H01L 29/792
                                                      438/258
(Continued)

FOREIGN PATENT DOCUMENTS

KR    1020160002337 A    1/2016
WO    2004053937 A2      6/2004

OTHER PUBLICATIONS

International Search Report and Written Opinion for PCT/US2017053588 dated Jun. 27, 2018 (13 pages).

(Continued)

*Primary Examiner* — Farun Lu
*Assistant Examiner* — Mohammad A Rahman
(74) *Attorney, Agent, or Firm* — Trop, Pruner & Hu, P.C.

(57) ABSTRACT

An embodiment includes an apparatus comprising: a substrate; a thin film transistor (TFT) comprising: source, drain, and gate contacts; a semiconductor material, comprising a channel, between the substrate and the gate contact; a gate dielectric layer between the gate contact and the channel; and an additional layer between the channel and the substrate; wherein (a)(i) the channel includes carriers selected from the group consisting of hole carriers or electron carriers, (a)(ii) the additional layer includes an insulator mate- (Continued)

rial that includes charged particles having a polarity equal to a polarity of the carriers. Other embodiments are described herein.

19 Claims, 8 Drawing Sheets

(51) Int. Cl.
  *H01L 29/51* (2006.01)
  *H01L 21/28* (2006.01)
  *H01L 29/66* (2006.01)
  *H01L 29/786* (2006.01)

(56) References Cited

U.S. PATENT DOCUMENTS

| | | | | |
|---|---|---|---|---|
| 2004/0108537 A1* | 6/2004 | Tiwari | ............... | H01L 29/40114 257/314 |
| 2006/0125010 A1* | 6/2006 | Bhattacharyya | ............................ | H01L 27/10814 257/E29.302 |
| 2008/0067594 A1 | 3/2008 | Madurawe | | |
| 2011/0297944 A1* | 12/2011 | Choi | ................... | H01L 27/3248 438/34 |
| 2013/0309808 A1* | 11/2013 | Zhang | ............... | H01L 29/66742 438/104 |
| 2015/0076612 A1* | 3/2015 | Maki | ................... | H01L 27/1104 257/368 |
| 2015/0364566 A1* | 12/2015 | Liu | ..................... | H01L 29/7831 438/197 |
| 2018/0315745 A1* | 11/2018 | Oikawa | .................. | H01L 27/13 |

OTHER PUBLICATIONS

"Charge trap flash," Wikipedia, downloaded Sep. 12, 2017.
"eDRAM", Wikipedia, downloaded Sep. 12, 2017.
Tyson, "EPROM—How ROM Works", HowStuffWorks, downloaded Sep. 12, 2017.
"Flash Memory", Wikipedia, downloaded Sep. 12, 2017.
"Floating-gate MOSFET", Wikipedia, downloaded Sep. 12, 2017.
"Memory cell (binary)", Wikipedia, downloaded Sep. 12, 2017.
Ruzyllo, "Semiconductor OneSource: Semiconductor Glossary—Search for: tft", downloaded Sep. 12, 2017.
"Thin-film transistor", Wikipedia, downloaded Sep. 12, 2017.

\* cited by examiner

THIN FILM TRANSISTOR WITH CHARGE TRAP LAYER

TECHNICAL FIELD

Embodiments of the invention are in the field of semiconductor devices and, in particular, thin film transistors.

BACKGROUND

A thin film transistor (TFT) may include a field effect transistor implemented using thin film technology. The thin films may include films of polycrystalline or amorphous silicon (or other thin film semiconductors) and a variety of insulating substrates. More specifically, a TFT may include a special kind of metal-oxide-semiconductor field effect transistor (MOSFET) made by depositing thin films of an active semiconductor layer as well as metallic contacts over a supporting (but relatively low-conducting or non-conducting) substrate. TFTs differ from conventional MOSFETs because the semiconductor material (and channel) of conventional MOSFETs is typically the substrate, such as a silicon wafer (instead of a thin film as is the case with a TFT).

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer (e.g., barrier layer, seed layer, etch stop layer) of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

Applicant has determined several shortcomings are present with conventional TFTs.

Figure 1:
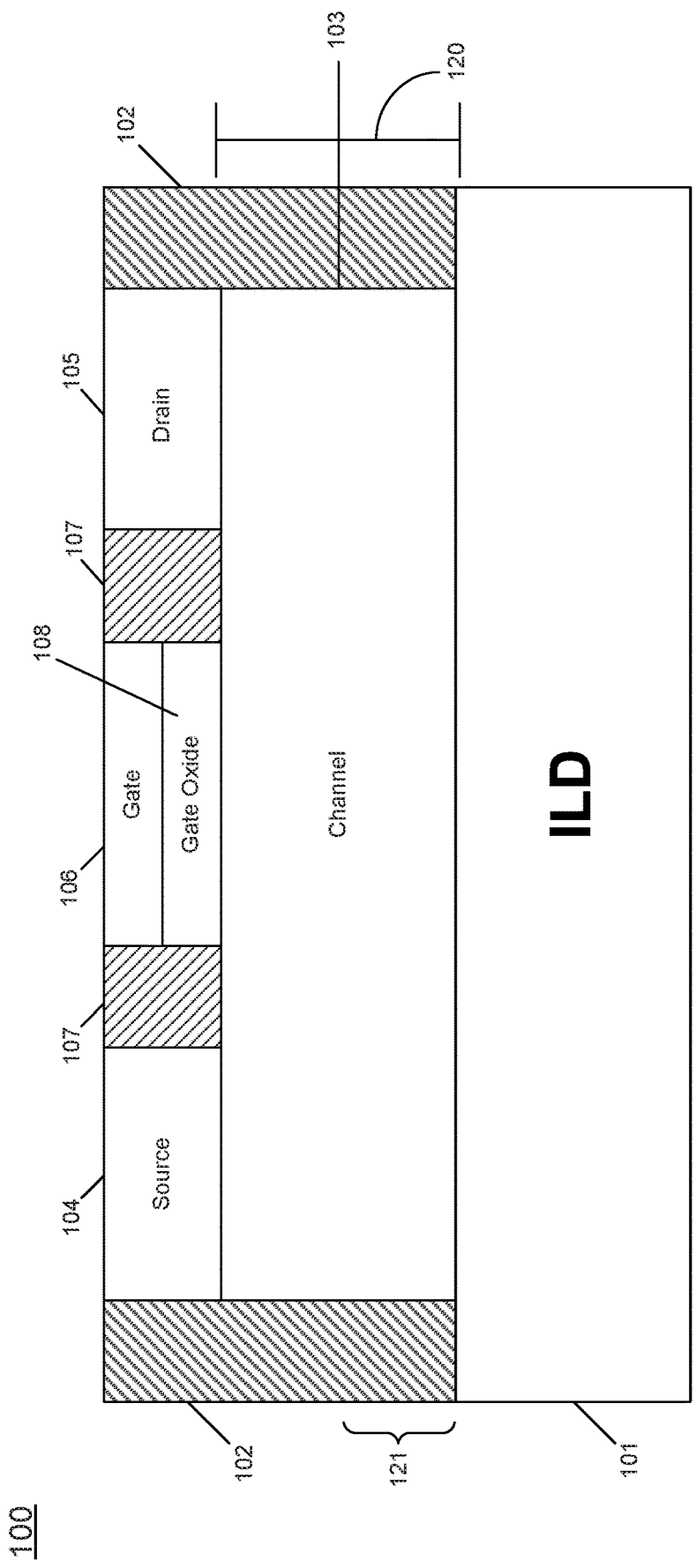
FIG. 1 includes a conventional TFT.

FIG. 1 includes a conventional TFT 100. Substrate 101 includes an inter-layer dielectric (ILD) material. A semiconductor material 103 comprising a channel is on the ILD layer. Source, drain, and gate contacts 104, 105, 106 are on the channel layer 103. The gate contact 106 is separated from the channel by gate oxide 108. Additional ILD material 102, 107 is adjacent contacts 104, 105, 106.

Applicant determined TFT 100 has a thick channel body (see thickness or height 120). To operate TFT 100 gate 106 may be positively biased which would turn off the TFT if the majority carrier comprises carrier holes. This would drive carrier holes away from gate 106 and towards the lower region 121 of channel material 103. However, Applicant further determined the interface (see region 121) between channel material 103 and ILD/substrate 101 may be imperfect due to various reasons.

For example, the region 121 may be imperfect to poor bonding between the materials of layers 101 and 103. As another example, the region 121 may be imperfect because there may be inconsistent charge accumulation in region 121 from sources such as plasma that includes Argon. Through manufacturing over time and many TFTs this charge accumulation may be inconsistent. The inconsistent charge may have a detrimental effect (i.e., inconsistent and hard to predict) on the TFT's threshold voltage (Vt), which is the voltage applied to the gate of the TFT that is necessary to open a conductive channel between source and drain (i.e., voltage necessary for the inversion layer to be formed at the semiconductor surface near the gate). The inconsistent charge may also adversely affect subthreshold swing (SS), which indicates the $V_{GS}$ required to increase $I_{DS}$ by one decade, as seen in the subthreshold region. A smaller SS is preferable in some embodiments because it can result in low power consumption and higher switching speed for the TFT. More specifically, Vt and SS are negatively impacted because the charge accumulation in region 121 may inconsistently attract or repel majority carriers in channel 103. Further, due to the height 120 (which can measure up to 5 to 60 nm in conventional TFTs) the ability for a field (induced via gate 106) may be limited in terms of its effect on the charges in region 121. Accordingly, a larger Vt (which may have negative impacts on power efficiency) may be needed to adequately supply $I_{DS}$.

Thus, for various reasons conventional TFTs may have a charge centroid that is relatively low (i.e., towards region 121) and that is more difficult to affect (i.e., offset) by the field generated from contact 106. However, an embodiment addresses these issues and provides improved electrostatic gate control and a more reliable (and lower in many cases) Vt that may be well controlled using traditional metal gate workfunction (WF) tuning. Such an embodiment employs a "charge trap" layer below or above the TFT to introduce a fixed charge that can set the channel potential (and hence Vt) of the device.

Figure 2:
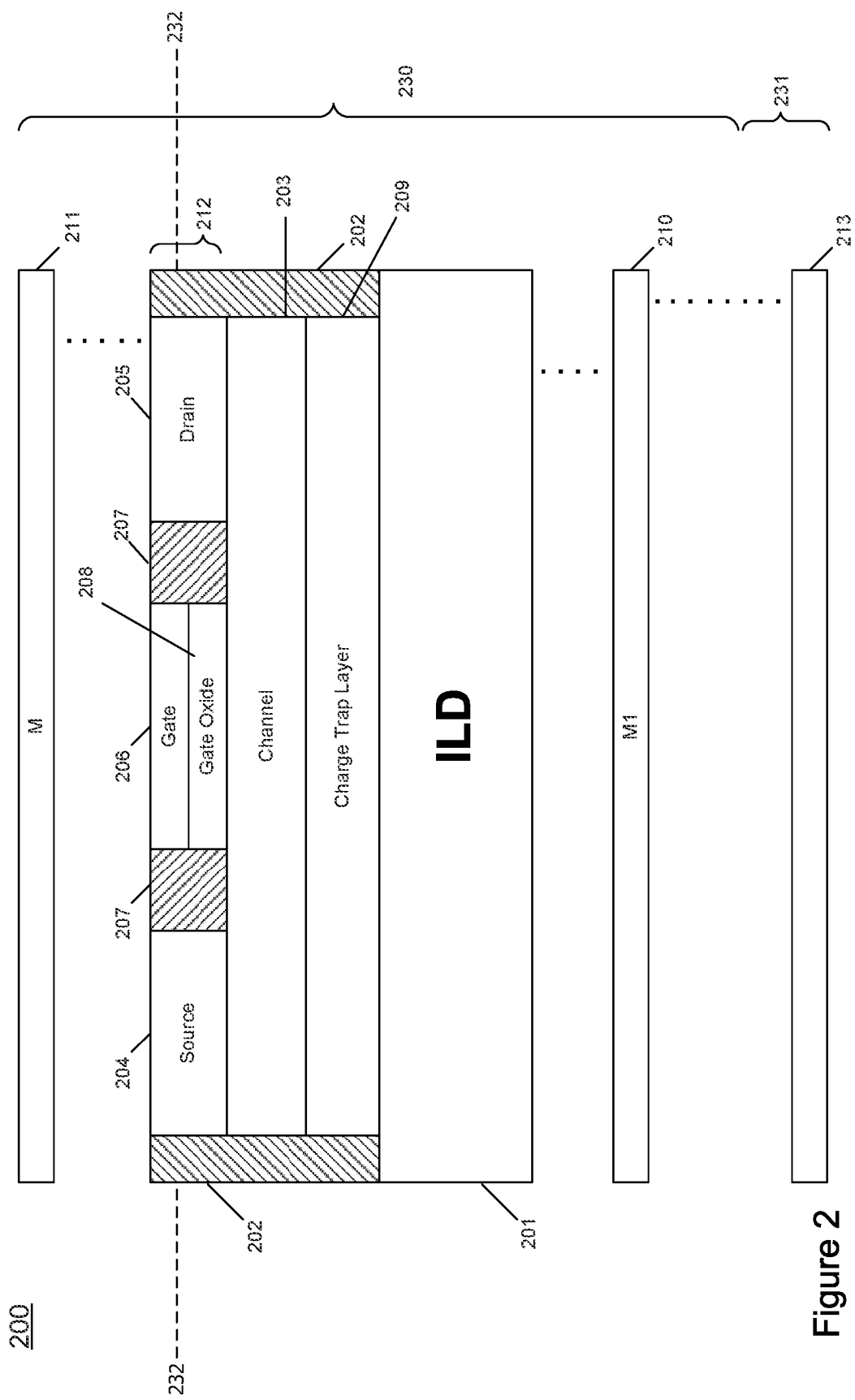
FIG. 2 includes a co-planar top-gate TFT in an embodiment.

FIG. 2 includes an embodiment. TFT 200 includes an ILD layer 201 between first and second metal layers 210, 211. The TFT comprises source, drain, and gate contacts 204, 205, 206. A semiconductor material 203, comprising a channel, is between the ILD layer and the second metal layer. A gate dielectric layer 208 is between the gate contact 206 and the channel 203. A charge trap layer 209 is between the channel and the ILD layer.

The channel includes carriers selected from the group consisting of hole carriers and electron carriers. For example, if the source and drain regions are positively doped the majority carriers may be hole carriers and if the source and drain regions are negatively doped the majority carriers may be electron carriers. The charge trap layer 209 includes an insulator material that includes charged particles having a polarity equal to a polarity of the carriers. Thus, when the majority carriers of the channel are hole carriers, the trap layer 209 may include positive ions such as positive ions of helium, neon, argon, krypton, xenon, radon, NH3, $NO_x$ (this is to make the Vt of the device negative) and when the majority carriers of the channel are electron carriers, the trap layer 209 may include negative ions such as negative ions of fluorine, chlorine, bromine, iodine, astatine, nitrogen, $BCl_3$, $SF_6$ and other species containing similar electronegative ions (this is to make the Vt of the device positive).

As used herein, a carrier is a "free carrier" such as an electron in the conduction band and a hole in the valence band of semiconductor that is free to carry electric charge, and hence, can contribute to the semiconductor conductivity. In contrast, a mere "charge" is a fixed charge in an insulative material (e.g., relatively locked within the matrix of an insulative material) that is not free to carry electric charge. Such a fixed charge may include an oxide fixed charge. Layer 209 (the "charge trap" layer) includes such an insulative material (also referred to herein as insulator material, such as a dielectric) that traps or fixes charges. For example, an oxide trapped or fixed charge includes charge centers in $SiO_2$ and other dielectrics which are electrically activated by trapping charge carriers injected into the oxide.

The charge trap layer 209 may be formed using, for example, plasma treatment with a negative ion. After which the channel layer 203 may be formed. As a result, a trap layer including positive ions will repel majority hole carriers driving majority hole carriers towards the gate 206 and consequently more under the control of the field of gate 206 than is possible with convention TFTs. A trap layer including negative ions will repel majority electron carriers driving majority electron carriers towards the gate 206 and consequently more under the control of the field of gate 206 than is possible with convention TFTs.

In FIG. 2 the source and drain both correspond to channel 203 and at least one of the source and the drain is doped with mobile carriers but the charge trap layer is not doped (generally speaking) with mobile carriers. Instead, the charged particles of the trap layer 209 are fixed and generally do not comprise mobile carriers.

In various embodiments, the gate dielectric may include aluminum oxide, hafnium oxide, aluminum nitride, silicon nitride, silicon dioxide, and the like.

While in the embodiment of FIG. 2 the substrate for the TFT 200 includes ILD 201, other embodiments may include a TFT substrate that includes glass, etchstop (e.g., silicon nitride), silicon with several layers of ILD (e.g., SiO2, SiN, HfO2, Al2O3, SiOC), and the like. Thus, TFT 200 constitutes a TFT because, for example, its channel layer is deposited as a thin film (rather than have a channel be a part of a substrate, such as a silicon wafer used for MOSFET channels).

The trap layer may include silicon nitride, hafnium oxide, silicon oxide, silicon oxynitride, aluminum oxynitride, aluminum nitride, aluminum oxide, silicon carbide, titanium oxide, and the like. More generally, the trap layer may include an oxide and/or nitride.

The channel layer may include zinc oxide, indium oxide, gallium oxide, indium gallium oxide, amorphous silicon, amorphous germanium, amorphous silicon germanium, polysilicon, polygermanium, poly germanium doped with boron, poly germanium doped with aluminum, poly germanium doped with phosphorous, poly germanium doped with arsenic, amorphous III-V materials, poly III-V materials, tin oxide, cupric oxide (CuO), cuprous oxide ($Cu_2O$), indium gallium zinc oxide (IGZO), IGZO with ratios 1:1:1 of each oxide, indium gallium zinc (IGZ), crystalline IGZO, amorphous IGZ, nanocrystalline IGZ, tungsten antimonide, indium antimonide, nickel oxide, cobalt oxide, indium tin oxide, tungsten disulphide, molybdenum disulphide, molybdenum selenide, black phosphorus, graphene, graphyne, borophene, germanene, silicene, Si2BN, stanene, phosphorene, molybdenite, poly-III-V (e.g., InAs, InGaAs, InP, amorphous InGaZnO (a-IGZO)), crystal (e.g., InGaZnO, (c-IGZO), GaZnON, ZnON), C-Axis Aligned Crystal (CAAC) (e.g., InGaZnO), and the like.

In an embodiment (e.g., FIG. 2) the channel 203 is between the gate dielectric 208 and the charge trap layer 209. Thus, embodiments may include a "top gate" TFT. However, not all embodiments are restricted to top gate TFTs. In other words, some embodiments may include bottom gate TFTs.

In an embodiment (e.g., FIG. 3) the channel 303 is between the source and gate contacts 304, 306. Thus, embodiments include "staggered" TFT configurations where the source and drain contacts are on opposite sides of the channel from the gate contact. More specifically, in FIG. 3 TFT 300 includes an ILD layer 301 (which is a substrate for TFT 300) between first and second metal layers 310, 311 and above substrate 313. The TFT comprises source, drain, and gate contacts 304, 305, 306. A semiconductor material 303, comprising a channel, is between the ILD layer and the second metal layer. A gate dielectric layer 308 is between the gate contact and the channel 303. A charge trap layer 309 is between the channel and the ILD layer. The channel includes carriers selected from the group consisting of hole carriers and electron carriers. The charge trap layer 309 includes an insulator material that includes charged particles having a polarity equal to a polarity of the carriers.

However, in other embodiments (e.g., FIG. 2) the channel 203 is between the source contact 204 and the ILD layer 201 and the channel 203 is between the gate contact 206 and the ILD layer 201. Thus, embodiments include "coplanar" TFT configurations where the source, drain, and gate contacts are on the same side of the channel.

In an embodiment the ILD layer 201 is included in a plane and an axis 232, parallel to the plane, intersects the source, drain, and gate contacts 204, 205, 206. In an embodiment axis 232 intersects dielectric material 207 located between the source and gate contacts 204, 206 and additional dielectric material 207 located between the gate and drain contacts 206, 205. Additional dielectric material 202 may be intersected by axis 232.

In an embodiment, the source and drain contacts 204, 205 are included in the second metal layer 212. Thus, embodiments address situations where TFTs are included in metal (M) layers of the "backend" of the device.

Regarding the "backend", once semiconductor wafers are prepared, a large number of process steps are still necessary to produce desired semiconductor integrated circuits. In general the steps can be grouped into four areas: Frontend Processing, Backend Processing, Test, and Packaging. Frontend and backend processing are pertinent to embodiments and are therefore described below.

Frontend processing refers to the initial steps in device fabrication. In this stage semiconductor devices (e.g., transistors) are created. A typical front end (also referred to herein as "frontend") process includes: preparation of the wafer surface (e.g., fin formation for a finFET) (see element 213 of FIG. 2), patterning and subsequent implantation of dopants to obtain desired electrical properties, growth or deposition of a gate dielectric, and growth or deposition of insulating materials to isolate neighboring devices.

Once the semiconductor devices have been created they must be interconnected to form the desired electrical circuits. This "Back End Processing" (BEOL) of the back end (also referred to herein as "backend") involves depositing various layers of metal (sometimes referred to herein as M layers (see layers 210, 212, 211 of FIG. 2) used to form traces, bit lines, word lines, and the like) and insulating material (sometimes referred to herein as V layers because such layers often include vias) in the desired pattern. Typically the metal layers consist of aluminum, copper, and the like. The insulating material may include SiO2, low-K materials, and the like (e.g., see layer 201 of FIG. 2). The various metal layers are interconnected by etching holes, called "vias", in the insulating material and depositing metal (e.g., Tungsten) in them. Thus, a backend portion may include, for example, 12 metal layers: a bottom metal layer (M0), a top metal layer (M11), and a plurality of metal layers (M1, M2, M3, M4, M5, M6, M7, M8, M9, and/or M10) between the bottom and top metal layers. The "bottom metal layer" is so named because the backend portion includes no metal layer between the bottom metal layer and a top of the frontend portion. The "top metal layer" is so named because the backend portion includes no metal layer between the top metal layer and the top of the backend portion. Having 12 metal layers is just an example and backend portions may include more (e.g., 14, 16, 18, 20 or more) or less (e.g., 4, 6, 8) metal layers.

Thus, in FIG. 2 layers 210 may be any M layer, layer 212 may be any M layer, and layer 211 may be any M layer. Further, TNT 200 comprises a substrate 213, wherein (a) the ILD layer 201 and M layers 210, 211, 212 are each included in a backend portion 230 of the apparatus, and (b) a frontend portion 231 of the apparatus is located between a portion of the substrate 213 and the frontend portion.

In an embodiment (e.g., FIG. 2), the charge trap layer 209 directly contacts the semiconductor channel 203. In an embodiment (e.g., FIG. 2), the charge trap layer 209 directly contacts the ILD layer 201.

Figure 4:
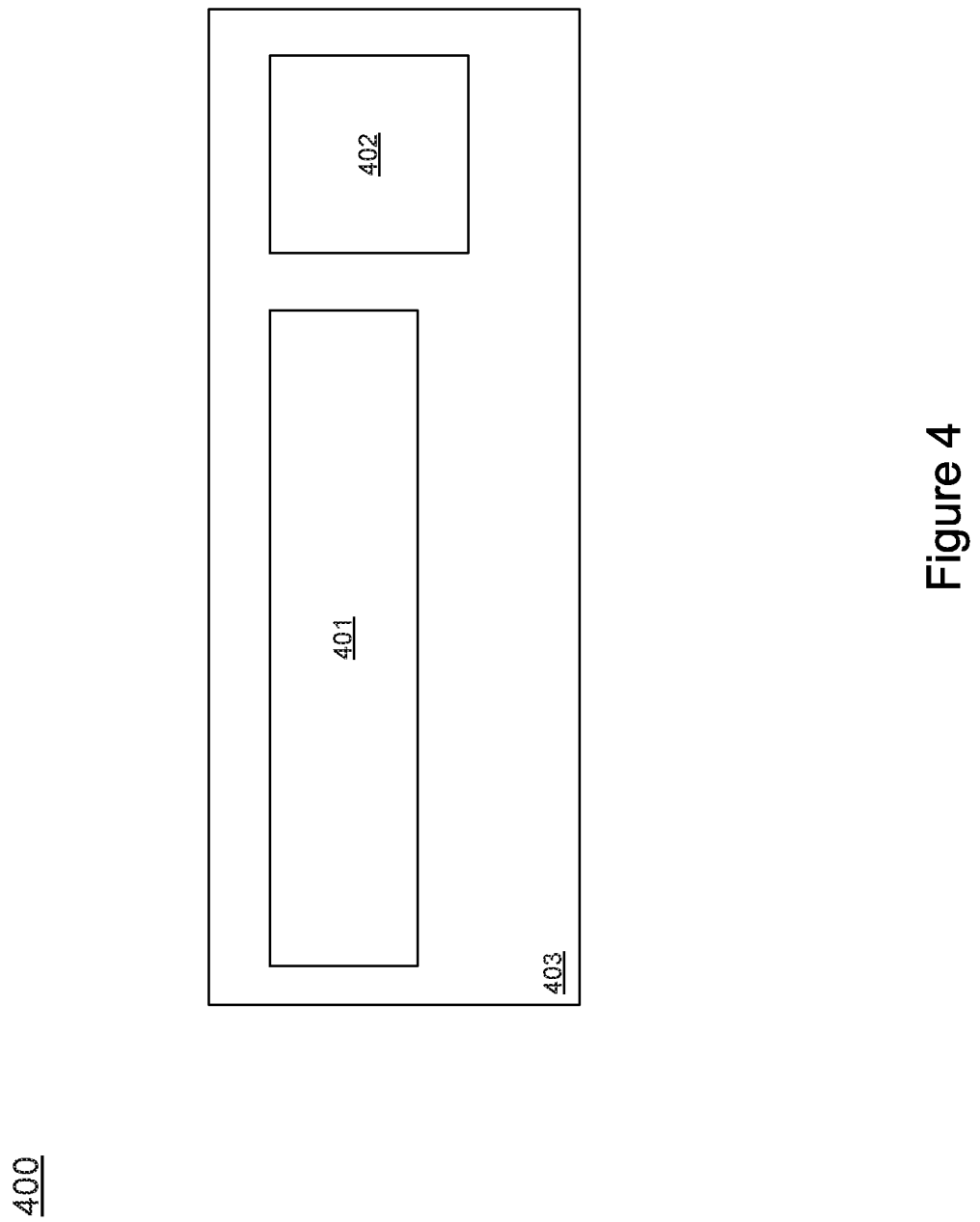
FIG. 4 includes a semiconductor package including a TFT-based memory in an embodiment.

FIG. 4 includes a single package 400 that includes a first die 401 (which may include at least one of a processor and an application specific integrated circuit (ASIC)), a second die (which may include embedded dynamic random access memory (e-DRAM) 402, which includes a memory cell that includes TFT 200 and/or TFT 300), and substrate 403 that supports dies 401, 402. The memory cell may include a single capacitor and a single TFT, such as the TFT 200 and/or TFT 300. However, in other embodiments modules such as a first module (which may include at least one of a processor and an ASIC) and a second module (which may include e-DRAM comprising a memory cell that includes TFT 200 and/or TFT 300) both on a single die.

Figure 8:
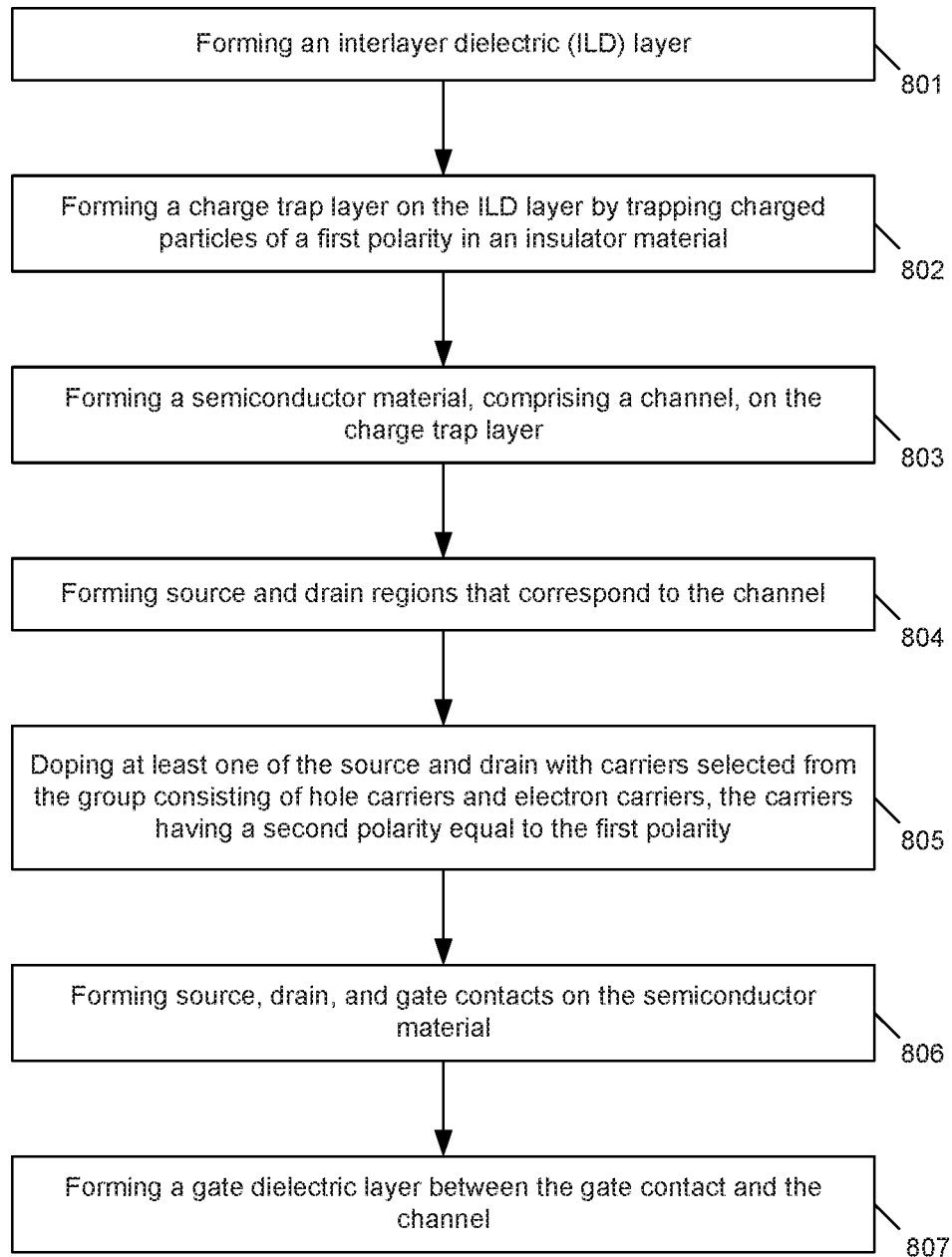
FIG. 8 includes a method of forming a TFT in an embodiment.

FIG. 8 includes a method 800 including forming an interlayer dielectric (ILD) layer (block 801); forming a charge trap layer on the ILD layer by trapping charged particles of a first polarity in an insulator material (block 802); forming a semiconductor material, comprising a channel, on the charge trap layer (block 803); forming source and drain regions that correspond to the channel (block 804); doping at least one of the source and drain with carriers selected from the group consisting of hole carriers and electron carriers, the carriers having a second polarity equal to the first polarity (block 805); forming source, drain, and gate contacts on the semiconductor material (block 806); and forming a gate dielectric layer between the gate contact and the channel (block 807).

Various embodiments include a semiconductive substrate (e.g., element 213). Such a substrate may be a bulk semiconductive material this is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

Figure 5:
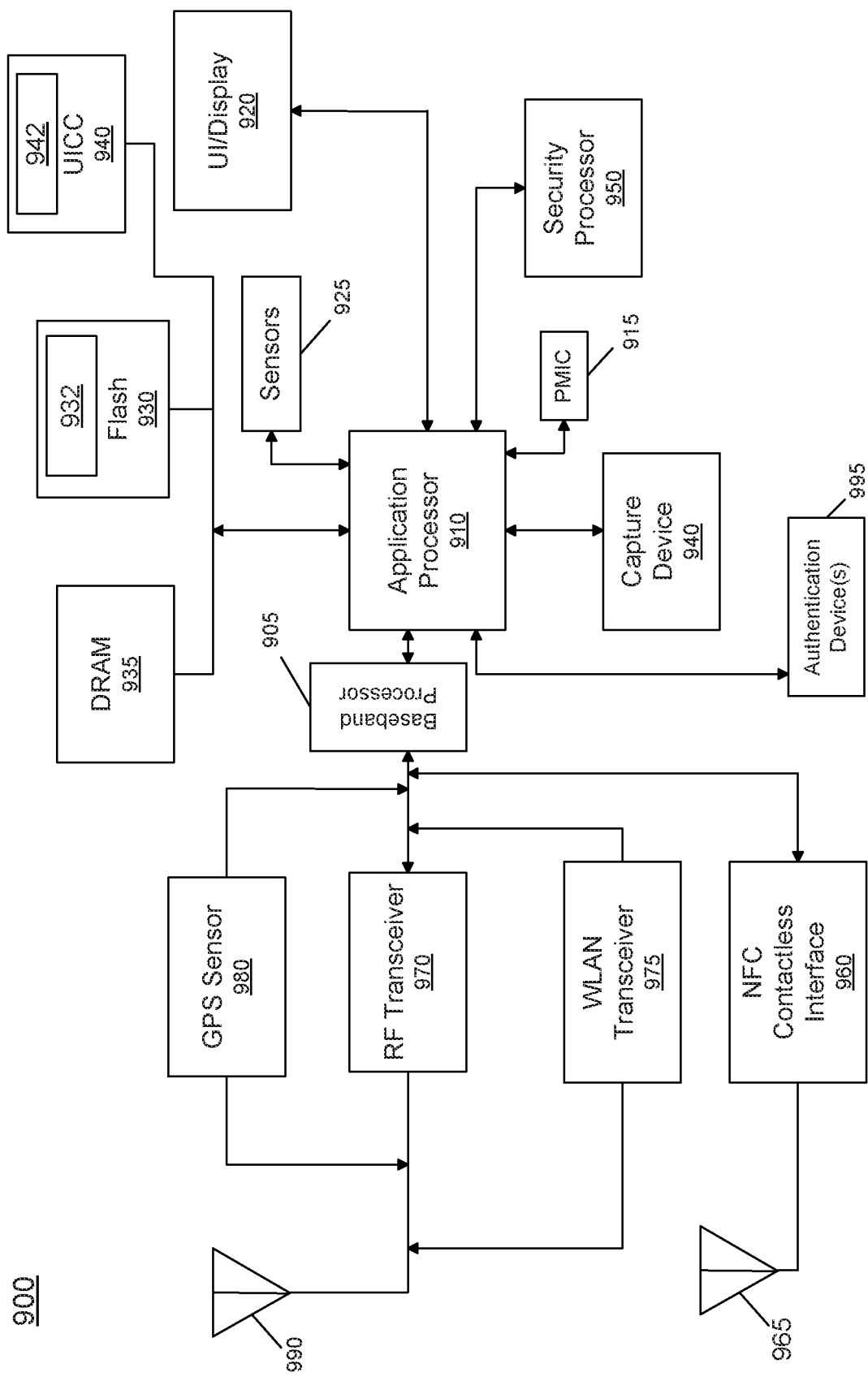
FIGS. 5, 6, 7 include systems that include TFTs described herein.

Referring now to FIG. 5, shown is a block diagram of an example system with which embodiments can be used. As seen, system 900 may be a smartphone or other wireless communicator or any Internet of Things (IoT) device. A baseband processor 905 is configured to perform various signal processing with regard to communication signals to be transmitted from or received by the system. In turn, baseband processor 905 is coupled to an application processor 910, which may be a main CPU of the system to execute an OS and other system software, in addition to user applications such as many well-known social media and multimedia apps. Application processor 910 (which may be included in the package of FIG. 4) may further be configured to perform a variety of other computing operations for the device.

In turn, application processor 910 can couple to a user interface/display 920 (e.g., touch screen display). In addition, application processor 910 may couple to a memory system including a non-volatile memory, namely a flash memory 930 (which may include memory cells with TFTs such as those described in FIGS. 2, 3 and/or 4) and a system memory, namely a DRAM 935 (which may include memory cells such as those described in FIGS. 2, 3 and/or 4). In some embodiments, flash memory 930 may include a secure portion 932 (which may include memory cells such as those described in FIGS. 2, 3, and/or 4) in which secrets and other sensitive information may be stored. As further seen, application processor 910 also couples to a capture device 945 such as one or more image capture devices that can record video and/or still images.

A universal integrated circuit card (UICC) 940 comprises a subscriber identity module, which in some embodiments includes a secure storage 942 (which may include memory cells such as those described in FIGS. 2, 3, and/or 4) to store secure user information. System 900 may further include a security processor 950 (e.g., Trusted Platform Module (TPM)) that may couple to application processor 910. A plurality of sensors 925, including one or more multi-axis accelerometers may couple to application processor 910 to enable input of a variety of sensed information such as motion and other environmental information. In addition, one or more authentication devices 995 may be used to receive, for example, user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more IoT networks, various circuitries may be coupled between baseband processor 905 and an antenna 990. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 may be present, with location information being provided to security processor 950 for use as described herein when context information is to be used in a pairing process. Other wireless communications such as receipt or transmission of radio signals (e.g., AM/FM) and other signals may also be provided. In addition, via WLAN transceiver 975, local wireless communications, such as according to a Bluetooth™ or IEEE 802.11 standard can also be realized.

Figure 6:
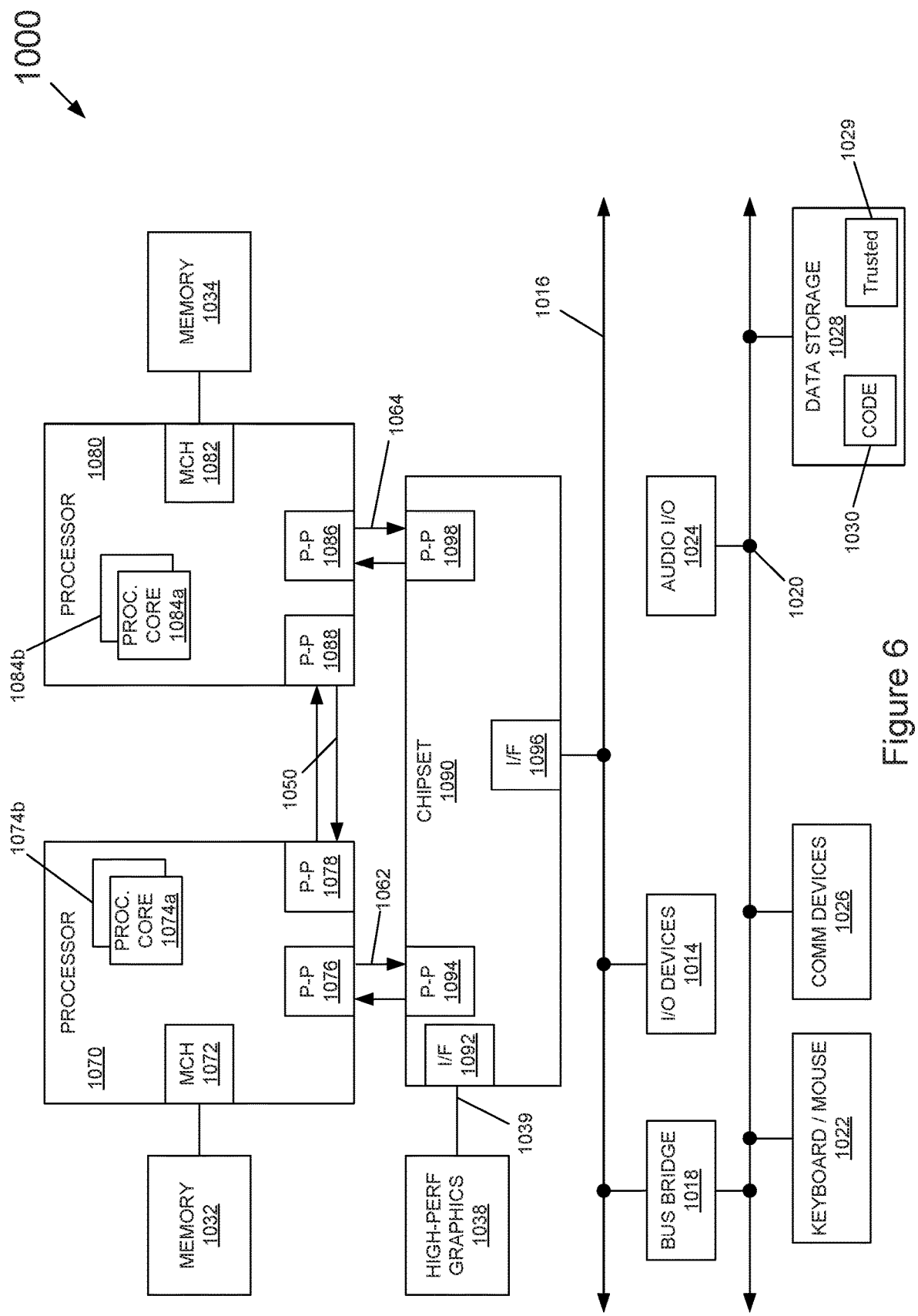

Referring now to FIG. 6, shown is a block diagram of a system in accordance with another embodiment of the present invention. Multiprocessor system 1000 is a point-to-point interconnect system such as a server system, and includes a first processor 1070 and a second processor 1080 coupled via a point-to-point interconnect 1050. Each of processors 1070 and 1080 may be multicore processors such as SoCs (which may be included in packages such as the package of FIG. 4), including first and second processor cores (i.e., processor cores 1074*a* and 1074*b* and processor cores 1084*a* and 1084*b*), although potentially many more cores may be present in the processors. In addition, processors 1070 and 1080 each may include a secure engine 1075 and 1085 to perform security operations such as attestations, IoT network onboarding or so forth.

First processor 1070 further includes a memory controller hub (MCH) 1072 and point-to-point (P-P) interfaces 1076 and 1078. Similarly, second processor 1080 includes a MCH 1082 and P-P interfaces 1086 and 1088. MCH's 1072 and 1082 couple the processors to respective memories, namely a memory 1032 and a memory 1034, which may be portions of main memory (e.g., a DRAM) locally attached to the respective processors. These memories may include memory cells with TFTs such as those described in FIGS. 2, 3, and/or 4. First processor 1070 and second processor 1080 may be coupled to a chipset 1090 via P-P interconnects 1052 and 1054, respectively. Chipset 1090 includes P-P interfaces 1094 and 1098.

Furthermore, chipset 1090 includes an interface 1092 to couple chipset 1090 with a high performance graphics engine 1038, by a P-P interconnect 1039. In turn, chipset 1090 may be coupled to a first bus 1016 via an interface 1096. Various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 such as a non-volatile storage or other mass storage device (which may include memory cells with TFTs such as those described in FIGS. 2, 3, and/or 4). As seen, data storage unit 1028 may include code 1030, in one embodiment. As further seen, data storage unit 1028 also includes a trusted storage 1029 (which may include memory cells with TFTs such as those described in FIGS. 2, 3, and/or 4) to store sensitive information to be protected. Further, an audio I/O 1024 may be coupled to second bus 1020.

Figure 7:
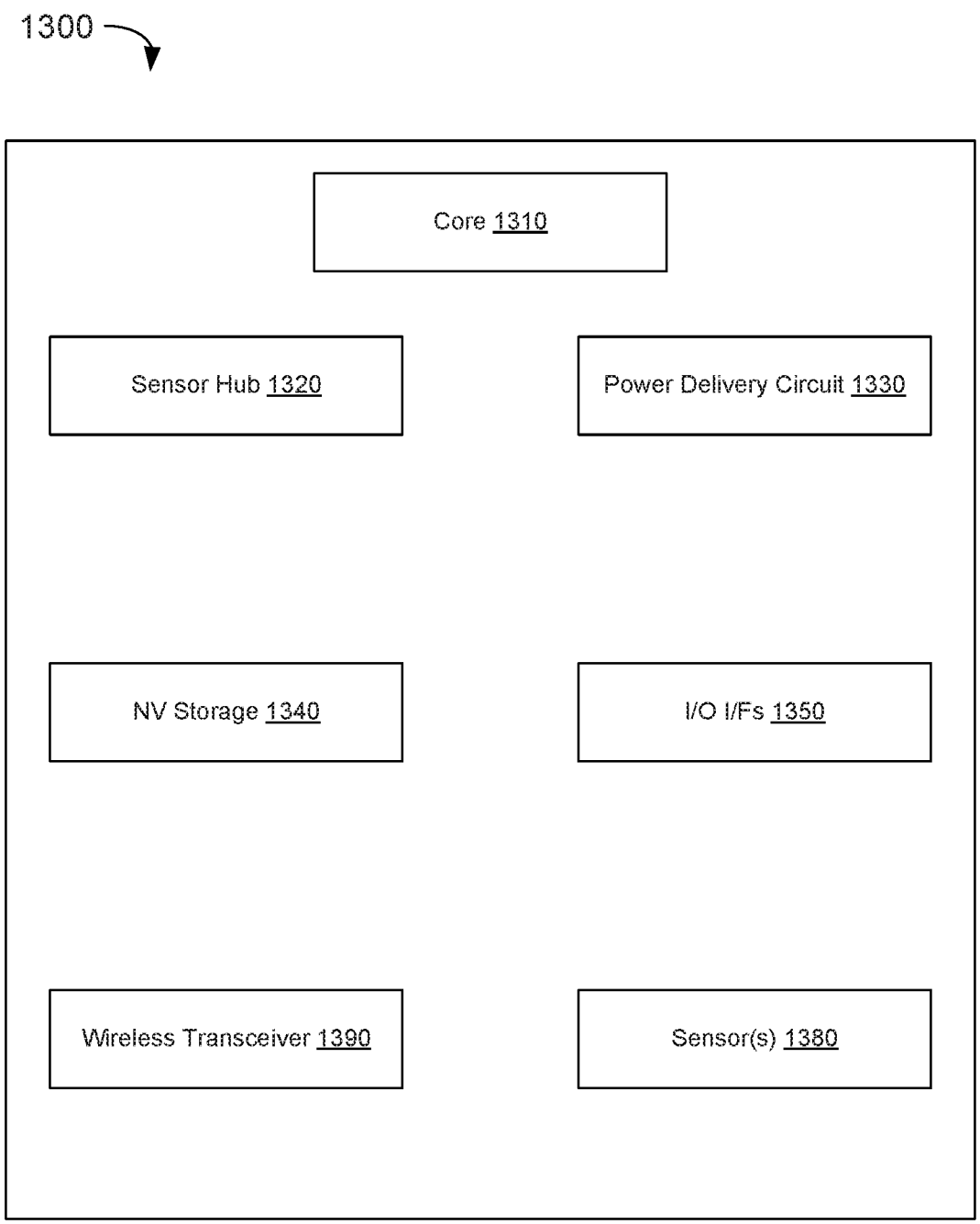

Embodiments may be used in environments where IoT devices may include wearable devices or other small form factor IoT devices. Referring now to FIG. 7, shown is a block diagram of a wearable module 1300 in accordance with another embodiment. In one particular implementation, module 1300 may be an Intel® Curie™ module that includes multiple components adapted within a single small module that can be implemented as all or part of a wearable device. As seen, module 1300 includes a core 1310 (of course in other embodiments more than one core may be present). Such core (which may be included in a package similar to FIG. 4) may be a relatively low complexity in-order core, such as based on an Intel Architecture® Quark™ design. In some embodiments, core 1310 may implement a TEE as described herein. Core 1310 couples to various components including a sensor hub 1320, which may be configured to interact with a plurality of sensors 1380, such as one or more biometric, motion environmental or other sensors. A power delivery circuit 1330 is present, along with a non-volatile storage 1340 (which may include memory cells with TFTs such as those described in FIGS. 2, 3, and/or 4). In an embodiment, this circuit may include a rechargeable battery and a recharging circuit, which may in one embodiment receive charging power wirelessly. One or more input/output (TO) interfaces 1350, such as one or more interfaces compatible with one or more of USB/SPI/I2C/GPIO protocols, may be present. In addition, a wireless transceiver 1390, which may be a Bluetooth™ low energy or other short-range wireless transceiver is present to enable wireless communications as described herein. Understand that in different implementations a wearable module can take many other forms. Wearable and/or IoT devices have, in comparison with a typical general purpose CPU or a GPU, a small form factor, low power requirements, limited instruction sets, relatively slow computation throughput, or any of the above.

The following examples pertain to further embodiments.

Example 1 includes an apparatus comprising: an interlayer dielectric (ILD) layer between first and second metal layers; a thin film transistor (TFT) comprising: source, drain, and gate contacts; a semiconductor material, comprising a channel, between the ILD layer and the second metal layer; a gate dielectric layer between the gate contact and the channel; and a charge trap layer between the channel and the ILD layer; wherein (a)(i) the channel includes carriers selected from the group consisting of hole carriers and electron carriers, (a)(ii) the charge trap layer includes an insulator material that includes charged particles having a polarity equal to a polarity of the carriers.

As mentioned above, a TFT has layers formed as thin layers. For example, the channel layer is not formed from a silicon substrate the way a MOSFET may be formed. By "thin" the following layers have heights (measured in same way (i.e., vertically) as height 120 in FIG. 1) such as: channel layer (height between 5-40 nm), gate dielectric layer such as layer 208 (height between 5-20 nm), charge trap layer (height between 2-20 nm), source/drain contacts (height between 5-40 nm).

Example 2 includes the apparatus of example 1 wherein the channel is between the gate dielectric and the charge trap layer.

Example 3 includes the apparatus of example 2 wherein the insulator material includes at least one of an oxide and a nitride.

Example 4 includes the apparatus of example 3 wherein the carriers include an ion of a member selected from the group consisting of helium, neon, argon, krypton, xenon, and radon.

Example 5 includes the apparatus of example 3 wherein the carriers include an ion of a member selected from the group consisting of fluorine, chlorine, bromine, iodine, and astatine.

Example 6 includes the apparatus of example 3 wherein the source and drain contacts are included in the second metal layer.

For example, the source and drain contacts 204, 205 may be "between" M layers 210, 211. However, source and drain contacts 204, 205 may also be said to be "between" M layers 210, 212 (even though they are at least partially in M layer 212).

Example 7 includes the apparatus of example 3 wherein the channel is between the source and gate contacts.

Figure 3:
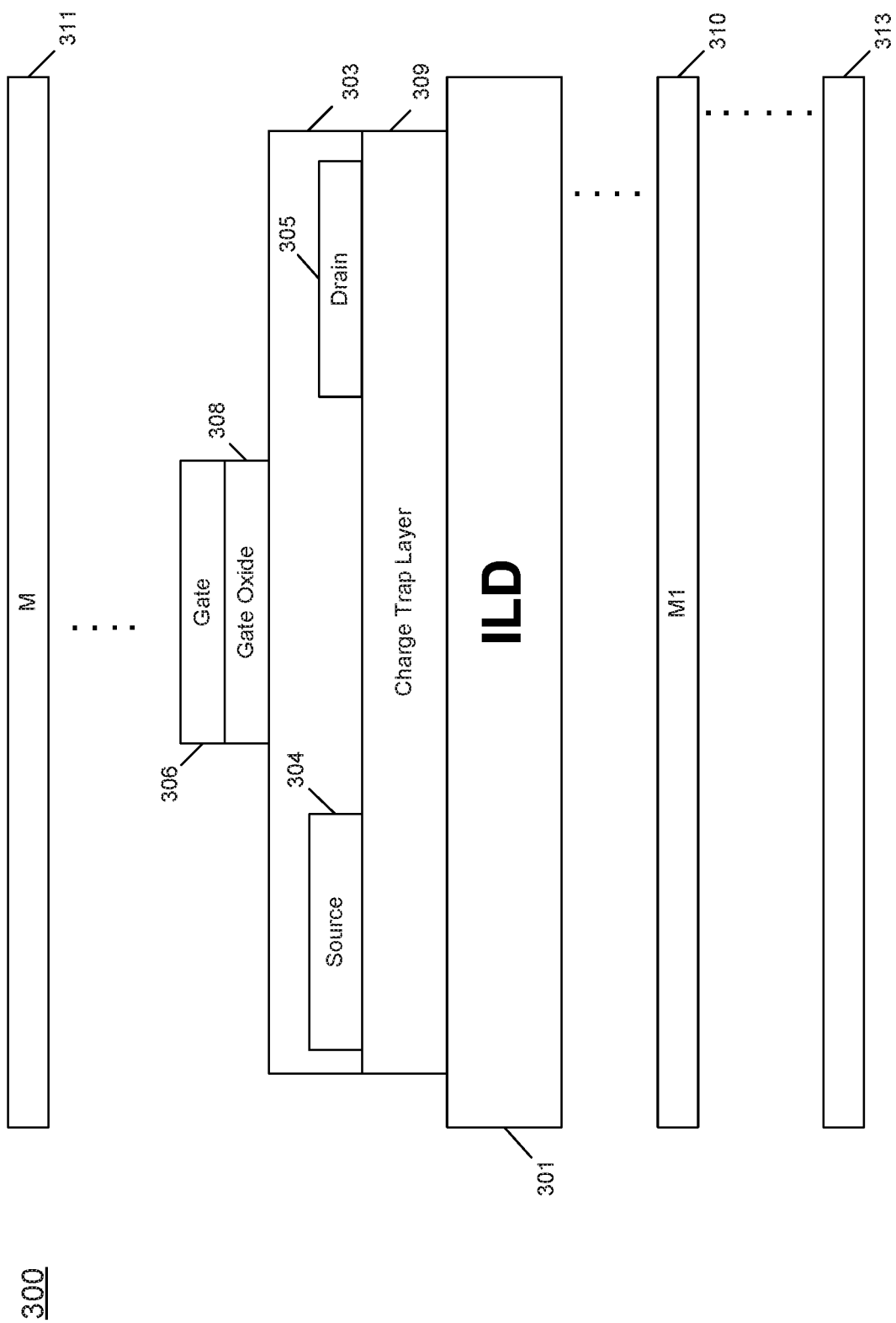
FIG. 3 includes a staggered top-gate TFT in an embodiment.

For example, see FIG. 3.

Example 8 includes the apparatus of example 3 wherein: the channel is between the source contact and the ILD layer; the channel is between the gate contact and the ILD layer.

For example, see FIG. 2.

Example 9 includes the apparatus of example 3 comprising a source and a drain both corresponding to the channel, wherein at least one of the source and the drain is doped with mobile carriers but the charge trap layer is not substantially doped with mobile carriers.

A person of ordinary skill in the art will understand "not substantially doped" to include some errant doping but not the level of doping present from an intentional doping, such as the doping of a source and/or drain to promote current movement through a channel.

Further, some embodiments do not require the source or drain to be doped and may instead rely on intrinsic carriers.

Example 10 includes the apparatus of example 9 wherein the charged particles are fixed and do not comprise mobile carriers.

Example 11 includes the apparatus of example 3 wherein the charge trap layer directly contacts the semiconductor channel.

Example 12 includes the apparatus of example 11 wherein the charge trap layer directly contacts the ILD layer.

Example 13 includes the apparatus of example 1 comprising a substrate, wherein (a) the ILD layer and first and second metal layers are each included in a backend portion of the apparatus, and (b) a frontend portion of the apparatus is located between a portion of the substrate and the backend portion.

Example 14 includes the apparatus of example 1 comprising: at least one of a processor and an application specific integrated circuit (ASIC); a memory cell that includes the TFT; and a single package including the memory cell and the at least one of the processor and the ASIC.

Example 15 includes the apparatus of example 14 comprising a die, wherein the memory cell and the at least one of the processor and the ASIC are both included on the die.

Example 16 includes the apparatus of example 1 wherein: the ILD layer is included in a plane; an axis, parallel to the plane, intersects the source, drain, and gate contacts.

Example 17 includes the apparatus of example 16 wherein the axis intersects dielectric material located between the source and gate contacts and additional dielectric material located between the gate and drain contacts.

Example 18 includes an apparatus comprising: a substrate; a thin film transistor (TFT) comprising: source, drain, and gate contacts; a semiconductor material, comprising a channel, between the substrate and the gate contact; a gate dielectric layer between the gate contact and the channel; and a charge trap layer between the channel and the substrate; wherein (a)(i) the channel includes carriers selected from the group consisting of hole carriers and electron carriers, (a)(ii) the charge trap layer includes an insulator material that includes charged particles having a polarity equal to a polarity of the carriers.

Example 19 includes the apparatus of example 18 comprising: a source and a drain both corresponding to the channel, wherein at least one of the source and the drain is doped with mobile carriers but the charge trap layer is not doped with mobile carriers; wherein the channel is between the gate dielectric and the charge trap layer; wherein the charge trap layer directly contacts the substrate.

Example 20 includes a system comprising: a memory; and a processor coupled to the memory, wherein at least one of the processor and the memory include a TFT according to any one of examples 1 to 19.

Example 21 includes a method comprising: forming an interlayer dielectric (ILD) layer; forming a charge trap layer on the ILD layer by trapping charged particles of a first polarity in an insulator material; forming a semiconductor material, comprising a channel, on the charge trap layer; forming source and drain regions that correspond to the channel; doping at least one of the source and drain with carriers selected from the group consisting of hole carriers and electron carriers, the carriers having a second polarity equal to the first polarity; forming source, drain, and gate contacts on the semiconductor material; and forming a gate dielectric layer between the gate contact and the channel.

Example 22 includes the method of example 21, wherein: the charge trap layer directly contacts the semiconductor channel; and the charge trap layer directly contacts the ILD layer.

Example 23 includes an apparatus comprising: a substrate; a thin film transistor (TFT) comprising: source, drain, and gate contacts; a semiconductor material, comprising a channel, between the substrate and the gate contact; a gate dielectric layer between the gate contact and the channel; and an additional layer between the channel and the substrate; wherein (a)(i) the channel includes carriers selected from the group consisting of hole carriers or electron carriers, (a)(ii) the additional layer includes an insulator material that includes charged particles having a polarity equal to a polarity of the carriers.

Example 24 includes the apparatus of example 23 comprising: a source and a drain both corresponding to the channel, wherein at least one of the source and the drain is doped with mobile carriers; wherein the channel is between the gate dielectric and the additional layer; wherein the additional layer directly contacts the substrate.

Example 1a includes an apparatus comprising: an interlayer dielectric (ILD) layer between first and second metal layers; a thin film transistor (TFT) comprising: source, drain, and gate contacts; a semiconductor material, comprising a channel, between the ILD layer and the second metal layer; a gate dielectric layer between the gate contact and the channel; and an additional layer between the channel and the ILD layer; wherein (a)(i) the channel includes carriers selected from the group consisting of hole carriers or electron carriers, (a)(ii) the additional layer includes an insulator material that includes charged particles having a polarity equal to a polarity of the carriers.

Example 2a includes the apparatus of example 1a wherein the channel is between the gate dielectric and the additional layer.

Example 3a includes the apparatus of example 2a wherein: the additional layer is a charge trap layer to substantially fix the charged particles; and the insulator material includes at least one of an oxide and a nitride.

Example 4a includes the apparatus of example 3a wherein: the carriers include an ion of a member selected from the group consisting of helium, neon, argon, krypton, xenon, radon, NH3, NOx, or combinations thereof; the insulator material includes a least one member selected from the group consisting of silicon nitride, hafnium oxide, silicon oxide, silicon oxynitride, aluminum oxynitride, aluminum nitride, aluminum oxide, silicon carbide, titanium oxide, or combinations thereof; the semiconductor material includes a member selected from the group consisting of zinc oxide, indium oxide, indium gallium oxide, amorphous silicon, amorphous germanium, amorphous silicon germanium, polysilicon, polygermanium, amorphous III-V materials, poly III-V materials, tin oxide, cupric oxide, cuprous oxide, or combinations thereof.

Example 5a includes the apparatus of example 3a wherein the carriers include an ion of a member selected from the group consisting of fluorine, chlorine, bromine, iodine, astatine, nitrogen, BCl3, SF6, or combinations thereof.

Example 6a includes the apparatus of example 3a wherein the source and drain contacts are included in the second metal layer.

Example 7a includes the apparatus of example 3a wherein the channel is between the source and gate contacts.

Example 8a includes the apparatus of example 3a wherein: the channel is between the source contact and the ILD layer; the channel is between the gate contact and the ILD layer.

Example 9a includes the apparatus of example 3a comprising a source and a drain both corresponding to the channel, wherein at least one of the source and the drain is doped with mobile carriers but the charge trap layer is substantially not doped with mobile carriers.

Example 10a includes the apparatus of example 9a wherein: the charged particles are fixed and do not comprise mobile carriers; the insulator material includes a least one member selected from the group consisting of silicon nitride, hafnium oxide, silicon oxide, silicon oxynitride, aluminum oxynitride, aluminum nitride, aluminum oxide, silicon carbide, titanium oxide, or combinations thereof; the semiconductor material includes a member selected from the group consisting of zinc oxide, indium oxide, gallium oxide, indium gallium oxide, amorphous silicon, amorphous germanium, amorphous silicon germanium, polysilicon, polygermanium, polygermanium doped with boron, polygermanium doped with aluminum, polygermanium doped with phosphorous, polygermanium doped with arsenic, amorphous III-V materials, poly III-V materials, tin oxide, cupric oxide (CuO), cuprous oxide (Cu2O), indium gallium zinc oxide (IGZO), indium gallium zinc (IGZ), crystalline IGZO, amorphous IGZ, nanocrystalline IGZ, tungsten antimonide, indium antimonide, nickel oxide, cobalt oxide, indium tin oxide, tungsten disulphide, molybdenum disulphide, molybdenum selenide, black phosphorus, graphene, graphyne, borophene, germanene, silicene, Si2BN, stanene, phosphorene, molybdenite, InAs, InGaAs, InP, amorphous InGaZnO (a-IGZO), crystalline InGaZnO, GaZnON, ZnON, c-Axis Aligned Crystal (CAAC) (e.g., InGaZnO), or combinations thereof.

Example 11a includes the apparatus of example 3a wherein the charge trap layer directly contacts the semiconductor channel.

Example 12a includes the apparatus of example 11a wherein the charge trap layer directly contacts the ILD layer.

Example 13a includes the apparatus of example 1a comprising a substrate, wherein (a) the ILD layer and first and second metal layers are each included in a backend portion of the apparatus, and (b) a frontend portion of the apparatus is located between a portion of the substrate and the backend portion.

Example 14a includes the apparatus of example 1a comprising: at least one of a processor and an application specific integrated circuit (ASIC); a memory cell that includes the TFT; and a single package including the memory cell and the at least one of the processor and the ASIC.

Example 15a includes the apparatus of example 14a comprising a die, wherein the memory cell and the at least one of the processor and the ASIC are both included on the die.

Example 16a includes the apparatus of example 1a wherein: the ILD layer is included in a plane; an axis, parallel to the plane, intersects the source, drain, and gate contacts.

Example 17a includes the apparatus of example 16a wherein the axis intersects dielectric material located between the source and gate contacts and additional dielectric material located between the gate and drain contacts.

Example 18a includes an apparatus comprising: a substrate; a thin film transistor (TFT) comprising: source, drain, and gate contacts; a semiconductor material, comprising a channel, between the substrate and the gate contact; a gate dielectric layer between the gate contact and the channel; and an additional layer between the channel and the substrate; wherein (a)(i) the channel includes carriers selected from the group consisting of hole carriers or electron carriers, (a)(ii) the additional layer includes an insulator material that includes charged particles having a polarity equal to a polarity of the carriers.

Example 19a includes the apparatus of example 18a comprising: a source and a drain both corresponding to the channel, wherein at least one of the source and the drain is doped with mobile carriers; wherein the channel is between the gate dielectric and the additional layer; wherein the additional layer directly contacts the substrate.

Example 20a includes a system comprising: a memory; and a processor coupled to the memory, wherein at least one of the processor and the memory include a TFT according to any one of examples 1a to 19a.

Example 21a includes a method comprising: forming an interlayer dielectric (ILD) layer; forming a charge trap layer on the ILD layer by trapping charged particles of a first polarity in an insulator material; forming a semiconductor material, comprising a channel, on the charge trap layer; forming source and drain regions that correspond to the channel; doping at least one of the source and drain with carriers selected from the group consisting of hole carriers or electron carriers, the carriers having a second polarity equal to the first polarity; forming source, drain, and gate contacts on the semiconductor material; and forming a gate dielectric layer between the gate contact and the channel.

Example 22a includes the method of example 21a, wherein: the charge trap layer directly contacts the semiconductor channel; and the charge trap layer directly contacts the ILD layer.

Example 23a includes an apparatus comprising: an interlayer dielectric (ILD) layer between first and second metal layers; a thin film transistor (TFT) comprising: source, drain, and gate contacts; a semiconductor material, comprising a channel, between the ILD layer and the second metal layer; a gate dielectric layer between the gate contact and the channel; and an additional layer between the channel and the ILD layer; wherein (a)(i) the channel includes carriers selected from the group consisting of hole carriers or electron carriers, (a)(ii) the additional layer includes a means for fixing charged particles having a polarity equal to a polarity of the carriers.

Example 24a includes the apparatus of example 23a wherein the channel is between the gate dielectric and the additional layer.

Example 25a includes the apparatus of example 23a wherein the means for fixing charged particles includes at least one of an oxide and a nitride.

Example 26a includes an apparatus comprising: a substrate; a thin film transistor (TFT) comprising: source, drain, and gate contacts; a semiconductor material, comprising a channel, between the substrate and the gate contact; a gate dielectric layer between the gate contact and the channel; and an additional layer between the channel and the substrate; wherein (a)(i) the channel includes carriers selected from the group consisting of hole carriers or electron carriers, (a)(ii) the additional layer includes a means for fixing charged particles having a polarity equal to a polarity of the carriers.

Example 27a includes the apparatus according to any of examples 1a, 3a, and 16a-17a wherein the channel is between the gate dielectric and the additional layer.

Example 28a includes the apparatus according to any of examples 16a-17a wherein: the additional layer is a charge trap layer to substantially fix the charged particles; and the insulator material includes at least one of an oxide and a nitride.

Example 29a includes the apparatus according to any of examples 6a to 17a wherein: the carriers include an ion of a member selected from the group consisting of helium, neon, argon, krypton, xenon, radon, NH3, NOx, or combinations thereof; the insulator material includes a least one member selected from the group consisting of silicon nitride, hafnium oxide, silicon oxide, silicon oxynitride, aluminum oxynitride, aluminum nitride, aluminum oxide, silicon carbide, titanium oxide, or combinations thereof the semiconductor material includes a member selected from the group consisting of zinc oxide, indium oxide, indium gallium oxide, amorphous silicon, amorphous germanium, amorphous silicon germanium, polysilicon, polygermanium, amorphous III-V materials, poly III-V materials, tin oxide, cupric oxide, cuprous oxide, or combinations thereof Example 30a includes the apparatus according to any of examples 6a to 17a wherein the carriers include an ion of a member selected from the group consisting of fluorine, chlorine, bromine, iodine, astatine, nitrogen, BCl3, SF6, or combinations thereof.

Example 31a includes the apparatus according to any of examples 7a to 17a wherein the source and drain contacts are included in the second metal layer.

Example 32a includes the apparatus according to any of examples 4a to 6a and 9a to 17a wherein the channel is between the source and gate contacts.

Example 33a includes the apparatus according to any of examples 4a to 6a and 9a to 17a wherein: the channel is between the source contact and the ILD layer; the channel is between the gate contact and the ILD layer.

Example 34a includes the apparatus according to any of examples 4a to 8a and 10a to 17a comprising a source and a drain both corresponding to the channel, wherein at least one of the source and the drain is doped with mobile carriers but the charge trap layer is substantially not doped with mobile carriers.

Example 35a includes the apparatus according to any of examples 5a to 17a wherein: the charged particles are fixed and do not comprise mobile carriers; the insulator material includes a least one member selected from the group consisting of silicon nitride, hafnium oxide, silicon oxide, silicon oxynitride, aluminum oxynitride, aluminum nitride, aluminum oxide, silicon carbide, titanium oxide, or combinations thereof; the semiconductor material includes a member selected from the group consisting of zinc oxide, indium oxide, gallium oxide, indium gallium oxide, amorphous silicon, amorphous germanium, amorphous silicon germanium, polysilicon, polygermanium, polygermanium doped with boron, polygermanium doped with aluminum, polygermanium doped with phosphorous, polygermanium doped with arsenic, amorphous III-V materials, poly III-V materials, tin oxide, cupric oxide (CuO), cuprous oxide (Cu2O), indium gallium zinc oxide (IGZO), indium gallium zinc (IGZ), crystalline IGZO, amorphous IGZ, nanocrystalline IGZ, tungsten antimonide, indium antimonide, nickel oxide, cobalt oxide, indium tin oxide, tungsten disulphide, molybdenum disulphide, molybdenum selenide, black phosphorus, graphene, graphyne, borophene, germanene, silicene, Si2BN, stanene, phosphorene, molybdenite, InAs, InGaAs, InP, amorphous InGaZnO (a-IGZO), crystalline InGaZnO, GaZnON, ZnON, c-Axis Aligned Crystal (CAAC) (e.g., InGaZnO), or combinations thereof.

Example 36a includes the apparatus according to any of examples 3a to 10a and 12a to 17a wherein the charge trap layer directly contacts the semiconductor channel.

Example 37a includes the apparatus according to any of examples 3a to 11a and 13a to 17a wherein the charge trap layer directly contacts the ILD layer.

Example 38a includes the apparatus according to any of examples 2a to 12a and 14a to 17a comprising a substrate, wherein (a) the ILD layer and first and second metal layers are each included in a backend portion of the apparatus, and (b) a frontend portion of the apparatus is located between a portion of the substrate and the backend portion.

Example 39a includes the apparatus according to any of examples 2a to 13a and 15a to 17a comprising: at least one of a processor and an application specific integrated circuit (ASIC); a memory cell that includes the TFT; and a single package including the memory cell and the at least one of the processor and the ASIC.

Example 40a includes the apparatus according to any of examples 2a to 14a and 16a to 17a comprising a die, wherein the memory cell and the at least one of the processor and the ASIC are both included on the die.

Example 41a includes the apparatus according to any of examples 2a to 15a wherein: the ILD layer is included in a plane; an axis, parallel to the plane, intersects the source, drain, and gate contacts.

Example 42a includes an apparatus comprising: an interlayer dielectric (ILD) layer between first and second metal layers; a thin film transistor (TFT) comprising: source, drain, and gate contacts; a semiconductor material, comprising a channel, between the ILD layer and the second metal layer; a gate dielectric layer between the gate contact and the channel; and an additional layer between the channel and the ILD layer; wherein (a)(i) the channel includes carriers selected from the group consisting of hole carriers or electron carriers, (a)(ii) the additional layer includes an insulator material that is configured to include charged particles having a polarity equal to a polarity of the carriers.

Thus, in some instances the TFT may not yet have the charges trapped in the insulator material. This may occur at a later time after the device has been released to the field (and long after the TFT was initially manufactured). Still, the insulator material may include a material such as silicon nitride or hafnium oxide that are structurally configured to fix charges once those charges are included in the material.

Example 43a includes an apparatus comprising: a substrate; a thin film transistor (TFT) comprising: source, drain, and gate contacts; a semiconductor material, comprising a channel, between the substrate and the gate contact; a gate dielectric layer between the gate contact and the channel; and an additional layer between the channel and the substrate; wherein (a)(i) the channel includes carriers selected from the group consisting of hole carriers or electron carriers, (a)(ii) the additional layer includes an insulator material to include charged particles having a polarity equal to a polarity of the carriers.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An apparatus comprising:
   an interlayer dielectric (ILD) layer between first and second metal interconnect layers;
   a thin film transistor (TFT) comprising:
      source, drain, and gate contacts;
      a semiconductor material, comprising a channel, between the ILD layer and the second metal interconnect layer;
      a gate dielectric layer between the gate contact and the channel; and
      an additional layer between the channel and the ILD layer;
   wherein (a)(i) the channel includes majority carriers selected from the group consisting of hole carriers or electron carriers, (a)(ii) the additional layer includes an insulator material that includes charged particles having a polarity equal to a polarity of the majority carriers.

2. The apparatus of claim 1 wherein the channel is between the gate dielectric and the additional layer.

3. The apparatus of claim 2 wherein:
   the additional layer is a charge trap layer to substantially fix the charged particles; and
   the insulator material includes at least one of an oxide, a nitride, or combinations thereof.

4. The apparatus of claim 3 wherein:
   the majority carriers include an ion of a member selected from the group consisting of helium, neon, argon, krypton, xenon, radon, $NH_3$, $NO_x$, or combinations thereof;
   the insulator material includes a least one member selected from the group consisting of silicon nitride, hafnium oxide, silicon oxide, silicon oxynitride, aluminum oxynitride, aluminum nitride, aluminum oxide, silicon carbide, titanium oxide, or combinations thereof;
   the semiconductor material includes a member selected from the group consisting of zinc oxide, indium oxide, indium gallium oxide, amorphous silicon, amorphous germanium, amorphous silicon germanium, polysilicon, polygermanium, amorphous III-V materials, poly III-V materials, tin oxide, cupric oxide, cuprous oxide, or combinations thereof.

5. The apparatus of claim 3 wherein the majority carriers include an ion of a member selected from the group consisting of fluorine, chlorine, bromine, iodine, astatine, nitrogen, $BCl_3$, $SF_6$, or combinations thereof.

6. The apparatus of claim 3 wherein:
   the channel is between the source and gate contacts;
   an axis intersects each of the channel, the source contact, and the drain contact.

7. The apparatus of claim 3 wherein:
   the channel is between the source contact and the ILD layer;
   the channel is between the gate contact and the ILD layer.

8. The apparatus of claim 3 comprising a source and a drain both corresponding to the channel, wherein at least one of the source and the drain is doped with mobile carriers but the charge trap layer is substantially not doped with mobile carriers.

9. The apparatus of claim 8 wherein:
   the charged particles are fixed and do not comprise mobile carriers;
   the insulator material includes a least one member selected from the group consisting of silicon nitride, hafnium oxide, silicon oxide, silicon oxynitride, aluminum oxynitride, aluminum nitride, aluminum oxide, silicon carbide, titanium oxide, or combinations thereof;

the semiconductor material includes a member selected from the group consisting of zinc oxide, indium oxide, gallium oxide, indium gallium oxide, amorphous silicon, amorphous germanium, amorphous silicon germanium, polysilicon, polygermanium, polygermanium doped with boron, polygermanium doped with aluminum, polygermanium doped with phosphorous, polygermanium doped with arsenic, amorphous III-V materials, poly III-V materials, tin oxide, cupric oxide (CuO), cuprous oxide (Cu2O), indium gallium zinc oxide (IGZO), indium gallium zinc (IGZ), crystalline IGZO, amorphous IGZ, nanocrystalline IGZ, tungsten antimonide, indium antimonide, nickel oxide, cobalt oxide, indium tin oxide, tungsten disulphide, molybdenum disulphide, molybdenum selenide, black phosphorus, graphene, graphyne, borophene, germanene, silicene, Si2BN, stanene, phosphorene, molybdenite, InAs, InGaAs, InP, amorphous InGaZnO (a-IGZO), crystalline InGaZnO, GaZnON, ZnON, c-Axis Aligned Crystal (CAAC) (e.g., InGaZnO), or combinations thereof.

10. The apparatus of claim 3 wherein the charge trap layer directly contacts the semiconductor channel.

11. The apparatus of claim 10 wherein:
the charge trap layer directly contacts the ILD layer;
the charge trap layer includes no sublayers.

12. The apparatus of claim 1 comprising a substrate, wherein (a) the ILD layer and first and second metal interconnect layers are each included in a backend portion of the apparatus, and (b) a frontend portion of the apparatus is located between a portion of the substrate and the backend portion.

13. The apparatus of claim 1 comprising:
at least one of a processor, an application specific integrated circuit (ASIC), or combinations thereof;
a memory cell that includes the TFT; and
a single package including the memory cell and the at least one of the processor, the ASIC, or combinations thereof.

14. The apparatus of claim 13 comprising a die, wherein the memory cell and the at least one of the processor, the ASIC, or combinations thereof are both included on the die.

15. The apparatus of claim 1 wherein:
the ILD layer is included in a plane;
an axis, parallel to the plane, intersects the source, drain, and gate contacts.

16. The apparatus of claim 1, wherein:
the ILD layer is between the first metal interconnect layer and the gate contact;
the first metal interconnect layer includes at least one of copper, aluminum, or combinations thereof.

17. The apparatus of claim 16, wherein the first metal interconnect layer includes a trace.

18. The apparatus of claim 16 comprising a substrate, wherein no metal layer is included between the substrate and the first metal interconnect layer.

19. The apparatus of claim 1, wherein the first metal interconnect layer includes a metal interconnect.

* * * * *